United States Patent
Wardle et al.

[11] Patent Number: 5,168,213
[45] Date of Patent: Dec. 1, 1992

[54] SWEPT SIGNAL ANALYSIS INSTRUMENT AND METHOD

[75] Inventors: Jay M. Wardle, Seattle; Ronald W. Potter, Snohomish; John A. Gibbs, Lynnwood, all of Wash.

[73] Assignee: Hewlett-Packard Company, Palo Alto, Calif.

[21] Appl. No.: 819,147

[22] Filed: Jan. 9, 1992

Related U.S. Application Data
[62] Division of Ser. No. 493,590, Mar. 13, 1990.

[51] Int. Cl.$^5$ ............................................. G01R 23/16
[52] U.S. Cl. .......................... 324/77 CS; 324/78 F; 324/77 C; 324/77 B; 364/825; 364/724.06
[58] Field of Search ............... 324/77 B, 77 C, 77 CS, 324/78 F; 364/484, 485, 553, 825, 724.06

[56] References Cited
U.S. PATENT DOCUMENTS
5,065,334 11/1991 Taylor ................................. 364/485

OTHER PUBLICATIONS
Tsakiris: "Resolution of a Spectrum Analyzer under dynamic operating conditions"-Rev. Sci. Instrum.-vol. 48-No. 11, Nov., 1977.

Primary Examiner—Kenneth A. Wieder
Assistant Examiner—Jose M. Solis

[57] ABSTRACT

The sweep rate limitations that heretofore have constrained the maximum sweep rates of swept analysis instruments (10,38) are obviated by optimizing filter circuitry (24,32,34,46) and post-processing the IF signal using various techniques to compensate for errors caused by fast sweeping.

5 Claims, 5 Drawing Sheets

SWEPT SIGNAL ANALYSIS INSTRUMENT AND METHOD

CROSS REFERENCE TO RELATED APPLICATION

This is a divisional of copending application Ser. No. 07/493,590, filed on Mar. 13, 1990.

FIELD OF THE INVENTION

The present invention relates to swept signal analysis instruments, such as spectrum analyzers and network analyzers, and more particularly relates to a method and apparatus permitting such instruments to be swept at fast rates.

BACKGROUND AND SUMMARY OF THE INVENTION

The term "swept signal analysis instrument" as used herein is a generic term referring to any electronic equipment in which an input signal is mixed to an intermediate frequency using a swept local oscillator and is subsequently filtered.

The most common swept signal analysis instruments are spectrum analyzers and network analyzers, and it is with reference to these instruments that the present invention is illustrated. In a spectrum analyzer, an input signal to be analyzed is heterodyned to an intermediate frequency (IF) using a swept local oscillator. The IF signal is filtered with a narrow bandwidth IF filter. The swept local oscillator has the effect of "sweeping" all the frequencies of the heterodyned-down input signal past the fixed frequency of the IF filter, thereby permitting the filter to resolve the input signal's spectral composition. The signal power within the filter bandwidth is determined by a detector cascaded after the IF filter and is typically displayed on a graphical display associated with the instrument.

A network analyzer is similar in many respects to a spectrum analyzer but instead of analyzing an unknown signal, the instrument analyzes an unknown network. To do this, the instrument excites the unknown network with a known signal and monitors the phase and amplitude characteristics of a resultant signal, thereby permitting the network's transfer function to be characterized. Again, the instrument relies on a swept local oscillator to heterodyne the input signal to an intermediate frequency, and the IF signal is again filtered prior to analysis. In a network analyzer, however, the IF filter serves to eliminate noise effects rather than to provide a narrow resolution bandwidth, and the filtered IF signal is analyzed to determine the phase and amplitude of the IF signal rather than its power. The analysis further includes "normalizing" the IF signal to the original excitation signal in order to reduce excitation source related errors.

All swept signal analysis instruments suffer from a common limitation, namely measurement errors caused by the sweeping operation. In spectrum analyzers, these errors manifest themselves as a degradation in the performance of the IF filter. As the sweep speed increases, spectral components of the input signal are swept at increased speeds through the filter. The behavior of the filter to these quasi-transient signals can be optimized by using a Gaussian filter response, thereby minimizing conventional dynamic problems such as ringing and overshoot. However, above a certain sweep rate, even an ideal Gaussian filter becomes unsatisfactory due to spreading of the filter passband and errors in amplitude (i.e. power) response. In particular, the filter passband approaches its impulse response shape when the sweep rate increases to infinity, and the amplitude of the response decreases with the square root of the sweep rate.

An ideal Gaussian response is often approximated by cascading a plurality of single-tuned filter stages. (A true Gaussian response cannot be physically realized since it is noncausal.) These cascaded stages generally include capacitors, inductors or crystals, and thus have transfer functions with poles. All transfer functions with poles exhibit non-flat group delay, also known as non-linear phase response. One problem with such filters is that they respond more quickly to the leading edge of an input transient signal than the trailing edge. Another problem is that the trailing edge often exhibits notches and ringing rather than a smooth fall to the noise floor. Small signals are difficult to differentiate from aberrations on the falling edge of nearby larger signals.

These problems, in conjunction with the magnitude errors caused by fast sweeping, have limited traditional analyzers to a maximum sweep rate of one half the filter bandwidth squared ($0.5\ BW^2$). At this rate, the magnitude error is about 1.18%, or less than 0.1 dB—generally considered to be an acceptable accuracy.

The mathematical derivation of the amplitude error and of the passband distortion resulting from fast sweeping is set forth in of Hewlett-Packard Application Note 63, May 1965.

An article by Tsakiris entitled "Resolution of a Spectrum Analyzer Under Dynamic Operating Conditions," Rev. Sci. Instrum., Vol. 48, No. 11, November, 1977 contains a similar analysis for a variety of spectrum analyzer filters.

In network analyzers, sweep related errors manifest themselves as errors in normalization and as irregularities in both the frequency and phase response of the noise limiting filter. Again, these errors increase with sweep speed and limit the maximum rate at which a network analyzer can sweep through a frequency range of interest.

In accordance with the present invention, the sweep rate limitations that heretofore have constrained the maximum sweep rates of swept analysis instruments are obviated by optimizing the filter circuitry and post-processing the IF signal using various techniques to compensate for fast sweeping errors.

The foregoing and additional features and advantages of the present invention will be more readily apparent from the following detailed description thereof, which proceeds with reference to the accompanying drawings.

DETAILED DESCRIPTION

Analysis of the response of an ideal Gaussian filter to swept frequency input signals shows that the response is both perfectly predictable and that none of the distortion apparent in traditional implementations exists.

Improved filters, with close to Gaussian magnitude response and flat group delay, may be "overswept." The amplitude of stationary signals decreases in a predictable manner that is a function of the bandwidth and the sweep rate, and that amplitude change may be used as compensation to provide accurate amplitude measurements.

Analysis also shows that, for a fixed sweep rate, a narrower than traditional bandwidth actually provides an improved signal to noise ratio. The signal to noise ratio is maximized when the sweep rate and resolution (filter) bandwidth are related by the following equation:

$$\text{Sweep rate} = 2.266(BW^2) \quad (1)$$

In this event, the signal to noise ratio is almost 2 dB better than at traditional bandwidths. This is due to the fact that the signal level decreases only about 1 dB because of the "oversweeping," while the noise level decreases about 3 dB.

Figure 1:
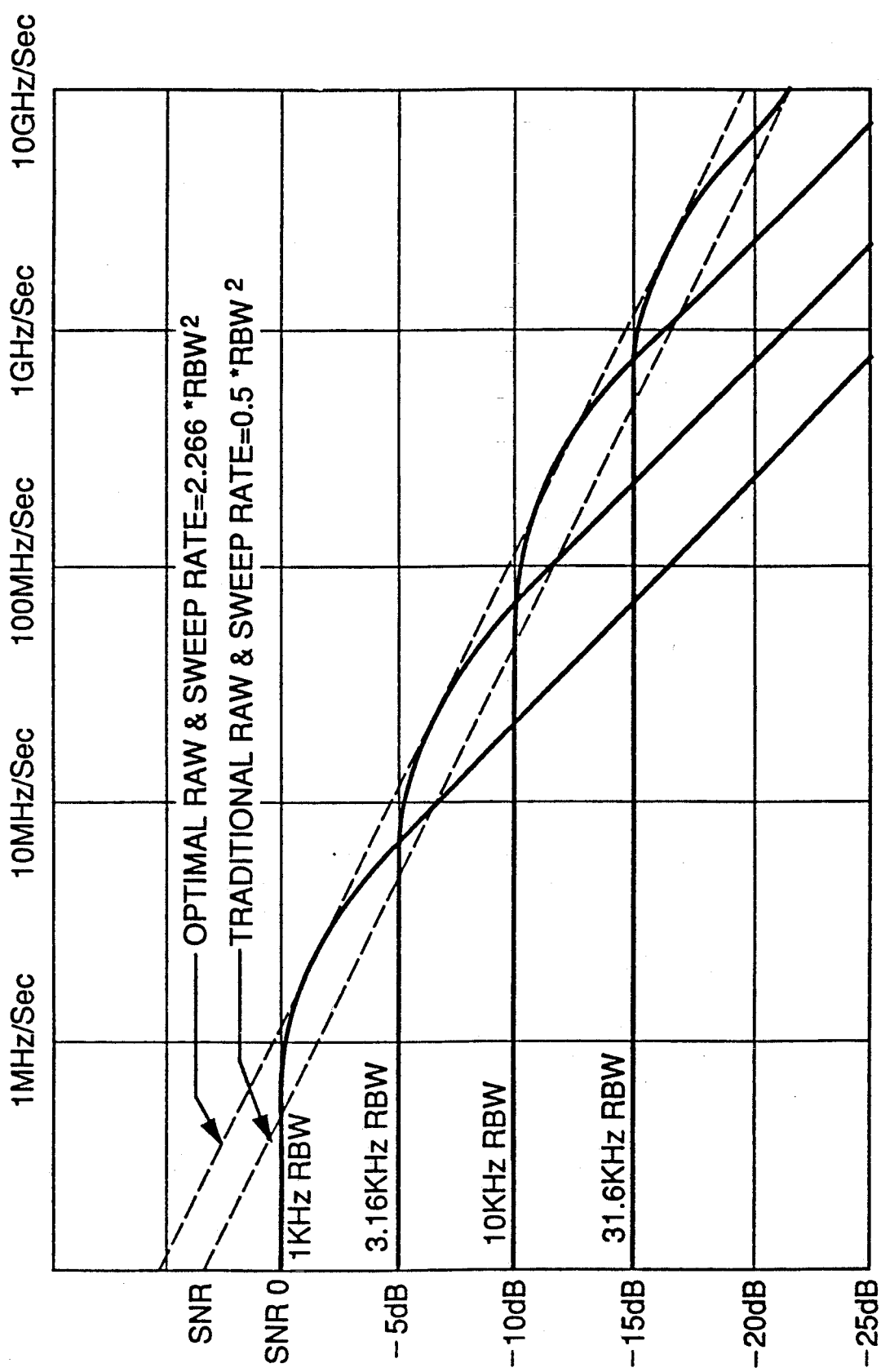
FIG. 1 is a plot showing several bandwidths of Gaussian filter over several decades of sweep rate.

FIG. 1 shows several bandwidths of Gaussian filter over several decades of sweep rate. The effect of different sweep rates and bandwidths on signal to noise ratio can readily be seen.

A further aspect of swept spectrum analysis that is improved by this invention is frequency resolution of signals. Improved resolution means being able to differentiate signals that are closer together. A useful concept to introduce is that of "apparent resolution." This is defined as the bandwidth of the swept response at some appropriate level below the peak response.

It is generally known that the response of a filter to a swept signal approaches the steady state frequency response when swept slowly, and the filter's response approaches its impulse response when swept very quickly. An ideal Gaussian frequency response filter has a Gaussian impulse response. The apparent resolution of a Gaussian filter is exactly its resolution bandwidth when swept slowly. As a Gaussian filter is swept more quickly, the apparent resolution gets wider, but the response remains Gaussian. Even at traditional sweep rates, the apparent resolution is a few percent wider than the nominal resolution bandwidth.

Further analysis shows that, for a fixed sweep rate, the apparent resolution is narrower when the actual bandwidth is less than traditional. This is due to the fact that, although the apparent resolution of the filter gets wider when overswept, the starting resolution was better. In fact, the optimal filter bandwidth for minimum apparent resolution is the same filter bandwidth that maximizes signal to noise ratio. The apparent resolution gets worse for even smaller bandwidths because the filter response is approaching its impulse response. The length of the impulse response varies inversely as the bandwidth.

Figure 2:
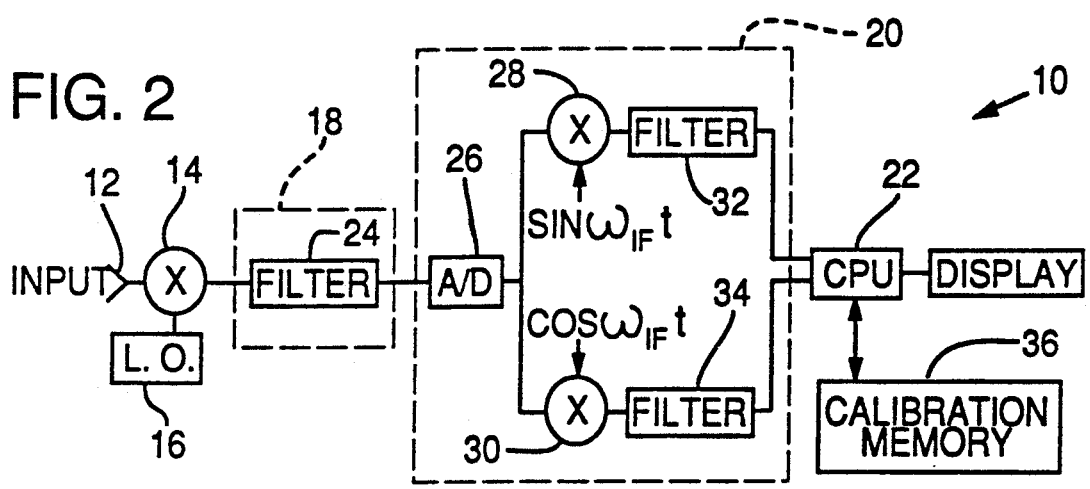
FIG. 2 is a schematic block diagram of a spectrum analyzer according to one embodiment of the present invention.

With the foregoing as background, and referring to FIG. 2, a spectrum analyzer 10 according to one embodiment of the present invention includes an analog input 12, a mixer 14 with an associated swept local oscillator 16, an analog IF chain 18, analog-to-quadrature digital conversion circuitry 20, and post-processing circuitry 22.

The analog IF chain 18 includes an IF filter 24 that sets the resolution bandwidth of the analyzer. According to one embodiment of the present invention, the behavior of this filter is optimized by improving its phase response and group delay characteristics.

It will be recognized that filter 24 may take several forms. In one embodiment, the filter is implemented in analog form, with cascaded lumped elements or crystals, or surface acoustic wave technology. Such filters can be equalized to yield magnitude response close to Gaussian, effectively eliminating unacceptable responses that cause distortions in the detected spectrum. In other embodiments, the filter is implemented in a finite-impulse-response (FIR) design, thereby achieving perfectly flat group delay. (In this latter embodiment, of course, the IF signal must be converted into digital form prior to filtering.) Again, nearly Gaussian response can be obtained, thereby greatly reducing filter-induced distortion mechanisms.

The analog-to-quadrature digital conversion circuitry 20 includes an analog-to-digital converter circuit 26, a pair of mixers 28, 30, and a corresponding pair of low pass filters 32, 34 (which preferably have a linear phase (flat group delay) characteristic). The analog-to-digital converter 26 samples the IF signal at periodic intervals and outputs a series of digital data samples corresponding thereto. These digital samples are multiplied with $\sin\omega t$ and $\cos\omega t$ signals by the mixers 28, 30 to yield digital representations of the real and imaginary components of the IF signal. Linear-phase (or flat group delay) filters 32, 34 filter the quadrature signals at baseband, equivalent to providing a linear-phase (or flat group delay) filter centered at the frequency $\omega_{IF}/2\pi$ Hz.

Quadrature analog-to-quadrature digital conversion circuitry 20 is generally known in the art, as described, inter alia, in U.S. Pat. No. 4,594,555, the disclosure of which is incorporated herein by reference.

Figure 3:
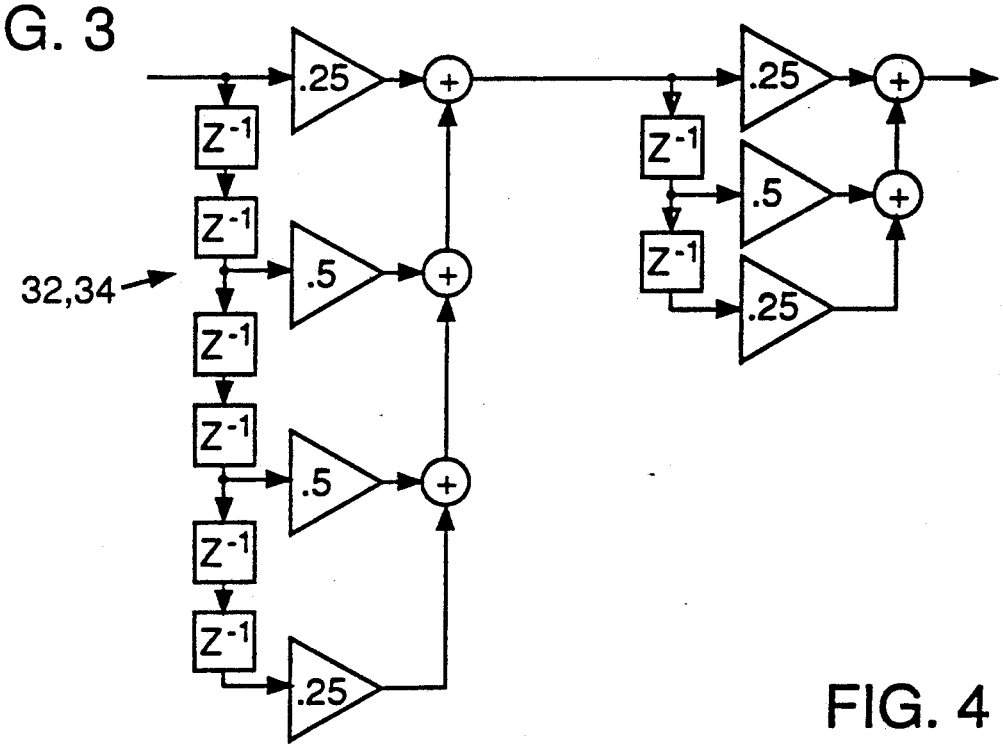
FIG. 3 is a schematic block diagram of a digital IF filter used in the spectrum analyzer of FIG. 2.

The filters 32, 34 in the illustrated embodiment are implemented digitally, as shown in FIG. 3. In the illustrated filter topology, the tap coefficients are selected to be powers of two, thereby permitting the use of bit shifters instead of multiplier stages. Each filter is implemented with 24-bit logic and a sample clock rate of 250 KHz to provide a filter bandwidth of 18 KHz. (Actually, a single filter is used for both real and imaginary data by multiplexing data through the filter at twice the sample rate.) Narrower filter widths can be achieved by filtering the IF signal repeatedly through IF filter 24, effectively halving the data bandwidth and sample rate for each pass through the filter. (The theory and implementation of such "decimation" filtering is provided in U.S. Pat. No. 4,881,191, which is also incorporated herein by reference.) Of course, filters 32, 34 can alternatively be implemented in analog form, if desired.

Even with the use of a Gaussian filter response, the analyzer will still exhibit an amplitude decrease of about 0.1 dB when swept at 0.5 $BW^2$, and more at faster rates. This amplitude decrease can be corrected by predicting the loss and applying a compensating sweep-dependent gain. The gain can be applied any place in the signal path. In most implementations, the compensating gain is applied in a CPU controlled post-processing stage 22 that may include a calibration memory 36.

The required compensation can be predicted in at least three ways. In the first, it can be computed using the solution of a swept Gaussian response. This approach is attractive because the solution exists in closed-form equations (as shown in the Tsakiris paper, supra) and is thus computationally efficient. In the second technique, the required compensation can be simulated, such as by using a computer model of the actual filter. This approach is more precise than approximating the true filter response as Gaussian, but is more computationally intensive. However, simulations can be performed at a number of sweep rates, and the compensations saved in a table for later use. Compensations for sweep rates other than the ones simulated can be interpolated from the values in the table. In the third compensation technique, the required compensation can be actually measured in the spectrum analyzer system. This can be done by sweeping through a known amplitude signal at the desired rate and measuring the decrease in amplitude. This is attractive because it takes variations in each individual instrument into account. Again, interpolation can be used to minimize the number of measurements that have to be made.

The fast sweeping also introduces an apparent frequency shift in the resulting data. This frequency shift can also be predicted (either in closed mathematical form (the formula is given in the Tsakiris paper)) or by one of the other techniques noted above. Once predicted, it can similarly be compensated for.

It will be recognized that the above-described embodiment provides several improvements to the art. One is the use of approximately gaussian filters of linear phase to a signal analysis instrument. While the amplitude response of such a filter may not be a substantial improvement over prior art cascaded synchronous single-tuned filter stages, the phase response is. That is, the linear-phase filtering employed in the illustrative embodiment offers the instrument a symmetric passband with essentially no ringing under dynamic conditions. The Tsakiris article indicates that asymmetric passband and dynamic ringing are unavoidable in such instruments.

Another improvement is the improved sensitivity and resolving power that can be achieved by "oversweeping" using a smaller than traditional bandwidth. Again, the Tsakiris article indicates that fast sweeping is to be avoided because it leads to a degradation of resolution and sensitivity.

Figure 4:
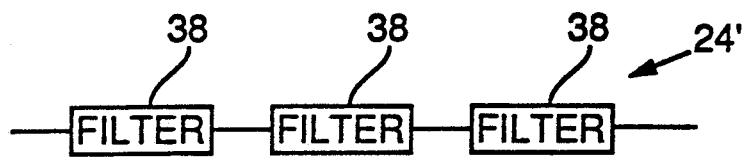
FIG. 4 is a schematic diagram of an IF filter comprised of a plurality of cascaded synchronously tuned filter stages.

In a second embodiment of the present invention, the IF filter 24 can be implemented using a conventional arrangement of a plurality of cascaded single tuned filter stages 38, as shown by filter 24' in FIG. 4. In this case, the resulting amplitude loss can again be predicted using any of the three methods detailed above and can be compensated accordingly. Since the cascaded stages exhibit a non-flat group delay, the filter also introduces a time delay, which translates into a frequency offset. This error term, too, can be predicted and corrected.

The same basic principles can be used to increase the sweep rate of a network analyzer. In this case, the error mechanisms include errors in normalization of the network output signal due to fast sweeping, and the errors caused by sweeping through the parabolic phase characteristic of the instrument's IF (aka noise limiting) filter. These error mechanisms can be determined and compensated, as detailed in Appendix F.

Figure 5:
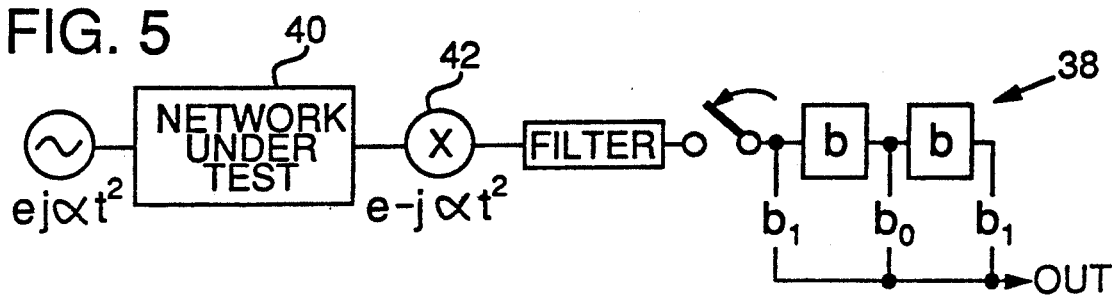
FIG. 5 is a partial schematic block diagram of a network analyzer employing a 3 tap FIR digital filter to correct for a parabolic phase sweeping error.

FIG. 5 shows a network analyzer 38 used to analyze a network under test 40. The analyzer 38 includes a swept mixer 42, an IF filter 44, and a simple 3-tap FIR filter 46 cascaded after IF filter 44 to mitigate the effects of parabolic phase errors. The coefficients (symmetrical) for the filter 46 are given by the following formulas:

$$b_1 = j/4\alpha T^2 \qquad (2)$$

$$b_0 = 1 - (j/2\alpha T^2) \qquad (3)$$

More complex filter topologies (i.e. more taps) can be used to yield commensurately better error compensation.

Another technique of compensating for the parabolic phase error is to add the results an increasing-frequency sweep to the conjugate of a corresponding decreasing-frequency sweep.

Yet another technique to equalize the parabolic phase error is to perform a Fourier transform on the raw data, multiply by a parabolic phase term, and then perform an inverse Fourier transform.

A final technique to compensate the parabolic phase error is by use of a parallel filter equalizer.

It will be recognized that the analyzer filter 44 windows the frequency transform of the network under test. The shape of this windowing function can be selected to optimize fast sweep speed performance.

If, at the desired sweep rate, the impulse response of the network under test falls entirely within the filter, then the filter should be flat to give a uniform window.

If, on the other hand, significant energy falls outside of the filter, then an exponential window will be found advantageous.

As disclosed in Appendix F, a variety of other windowing functions are advantageous for different circumstances. Accordingly, it is desirable to provide the instrument with a plurality of windowing functions and means for selecting therebetween. The preferred implementation is to provide a single filter and to implement the different windowing functions digitally. (Window selection is known in digital signal analyzers, but has not heretofore been employed in network analyzers.) In such an embodiment, a desirable filter is the Nyquist zero symbol interference filter.

It will be recognized that all the foregoing error compensation techniques are independent of the network under test.

A Network Analyzer attempts to estimate the frequency response of a casual, linear network by exciting the network with a swept sine stimulus. Sources of error include finite measurement time, stimulus sweep rate, finite bandwidth of receiver as well as noise and measurement accuracy.

Error correction techniques currently used (including normalization, 3-term and 12-term error correction) depend on the errors due to sweeping being small. This often requires very slow sweep rates resulting in unacceptably long test times, particularly for manufacturing applications.

This paper outlines the development of DSP techniques to correct the errors due to sweep rate and hence allow drastically faster measurements to the same degree of accuracy.

Notes:
1) Since all work will be linear, I will only use complex signal representations.
2) A swept sine wave has a complex notation of $$e^{j\alpha t^2}$$

where $\alpha$ = sweep rate radians/sec$^2$
and $F = 2\alpha t$ = instantaneous radian frequency.

Start by analyzing a single channel network analyzer: Assume the stimulus is represented by the foregoing equation. The device under test has a transfer function (h(t). A mixer mixes the resulting output signal from the device under test with a sine wave at the frequency:

$$e^{-j\alpha t^2}$$

The output of the mixer, x(t) is then provided to a noise limiting filter having a transfer function of g(t). The output of the noise filter is the system output signal, y(t). (It will be recognized that a multi-conversion receiver can be represented in the same fashion.) The mixer output, x(t), is:

$$x(t) = e^{-j\alpha t^2} \int_{-\infty}^{\infty} h(\tau) e^{+j\alpha(t-\tau)^2} d\tau \quad \text{(convolution)}$$

$$= \int_{-\infty}^{\infty} h(\tau) e^{j\alpha\tau^2} e^{-j(2\alpha t)\tau} d\tau$$

The filter output, y(t), is: (convolution again)

$$y(t) = \int_{-\infty}^{\infty} g(\tau_1) \int_{-\infty}^{\infty} h(\tau) e^{+j\alpha\tau^2} e^{-j2\alpha(t-\tau_1)\tau} d\tau \, d\tau_1$$

exchanging order of integration $$y(t) = \int_{-\infty}^{\infty} h(\tau) e^{j\alpha\tau^2} \int_{-\infty}^{\infty} g(\tau_1) e^{-j(-2\alpha\tau)\tau_1} d\tau_1 \, e^{-j(2\alpha t)\tau} d\tau$$

The inside integral is a Fourier transform where $-2\alpha\tau$ replaces the usual $\omega$. So:

$$\boxed{y(t) = \int_{-\infty}^{\infty} h(\tau) e^{j\alpha\tau^2} G(-j2\alpha\tau) e^{-j(2\alpha t)\tau} d\tau}$$

This is the basic equation that governs the performance of a swept network analyzer. Note that the output, y(t), is the desired Fourier transform at the instantaneous frequency $2\alpha t$, but it is windowed by the function $$W(t) = G(-j2\alpha\tau)e^{j\alpha\tau^2}$$

Notice that as the sweep rate falls below a critical value, and $$e^{j\alpha\tau^2} \approx 1$$

$$G(-j2\alpha\tau) \approx \text{constant}$$

for all $\tau$ where $h(\tau)$ is non-zero.
Hence, for sufficiently slow sweeps $$y(t) \approx \int_{-\infty}^{\infty} h(\tau) e^{-j(2\alpha t)\tau} d\tau$$

(if we restrict $G(o) = 1$)
which is the desired Fourier transform.

There are two error components which must remain small for all $\tau$ where $h(\tau)$ has significant energy.

If we say $h(\tau)$ has died out (to the desired degree of accuracy) at time $\tau_c$ and note $$h(\tau) \triangleq 0 \quad \text{for } \tau < 0$$
$$\text{(causal)}$$

we need $$G(-j2\alpha\tau)e^{j\alpha\tau^2} \approx 1 \text{ for } 0 \leq \tau \leq \tau_c$$

Notice that if $G(j\omega)$ has a parabolic phase $$G(j\omega) = |G(j\omega)| e^{-j\frac{\omega^2}{4\alpha}}$$

Then $$G(-j2\alpha\tau) e^{j\alpha\tau^2} = e^{-j\frac{4\alpha^2\tau^2}{4\alpha}} e^{j\alpha\tau^2} |G(-j2\alpha\tau)|$$
$$= |G(-j2\alpha\tau)|$$

Then $$y(t) = \int_{-\infty}^{\infty} h(\tau) w(2\alpha\tau) e^{-j(2\alpha t)\tau} d\tau$$

where w is a window function.

$$W(2\alpha\tau) = |G(-j2\alpha\tau)|$$

Notice that the frequency domain shape of the noise limiting, parabolic-phase filter should have a "good" shape like Hanning (raised cosine) to ensure a good estimation of the frequency response even if the sweep rate is not so slow as to make the response self-windowing.

Notice also that the necessary parabolic phase is not dependent on h(t) (the DUT).

In the next part of this appendix, the following are shown:
1) Sweep rate improvements possible for high Q networks
2) Digital filter designs (IIR and FIR) for the parabolic phase
3) First order error corrections by adding an upsweep to the conjugate of a down-sweep
4) Inaccurate normalization and error correction due to the above windowing and optimal windows under these conditions.

Recalling the fundamental network analyzer equation, $$y(t) = \int_{-\infty}^{\infty} h(\tau) e^{j\alpha\tau^2} G(-j2\alpha\tau) e^{-j(2\alpha t)\tau} d\tau$$

let $$\omega = 2\alpha t$$

$$y\left(\frac{\omega}{2\alpha}\right) = \int_{-\infty}^{\infty} h(\tau) e^{j\alpha\tau^2} G(-j2\alpha\tau) e^{-j\omega\tau} d\tau$$

Noting $$e^{j\alpha\tau^2} = 1 + (j\alpha\tau^2) + \frac{1}{2!}(j\alpha\tau^2)^2 + \frac{1}{3!}(j\alpha\tau^2)^3 + \ldots$$

and also recall that $$\frac{\partial^n H}{\partial \omega^n} \triangleq D^n H = \int_{-\infty}^{\infty} h(\tau)(-j\tau)^n e^{-j\omega\tau}d\tau$$

so $$y\left(\frac{\omega}{2\alpha}\right) = \left(1 + \frac{j\alpha}{(-j)^2}D^2 + \frac{(j\alpha)^2}{(-j)^4 2!}D^4 + \ldots\right)H_w(j\omega)$$

where $$H_w(j\omega) \triangleq \int_{-\infty}^{\infty} h(\tau)G(-j2\alpha\tau)e^{-j\omega\tau}d\tau$$

or $$y\left(\frac{\omega}{2\alpha}\right) = \left(1 - j\alpha D^2 - \frac{\alpha^2}{2!}D^4 - \ldots\right)H_w(j\omega)$$

We can see that the error in the swept response depends on how fast $H_w$ changes with frequency. For a straight-through wire, all derivatives are zero, and there is no error.

Now, because the source flatness is a significant source of error, all measurements are actually normalized. As we shall see, taking the ratio of two swept measurements does not correctly normalize the result.

Analysis: Let us model the source unflatness as an ideal source followed by a filter, $S(j\omega)$ (which is not necessarily realizable).

To begin with, let us assume that we can ignore the effects of the noise-limiting filter. Then the reference channel measurements are $$R\left(\frac{\omega}{2\alpha}\right) = \left(1 - j\alpha D^2 - \frac{\alpha^2}{2!}D^4 - \ldots\right)S(j\omega)$$

and the "A" channel is $$A\left(\frac{\omega}{2\alpha}\right) = \left(1 - j\alpha D^2 - \frac{\alpha^2}{2!}D^4 - \ldots\right)H(j\omega)S(j\omega)$$

If the sweep speeds are small enough so that we can ignore error terms above second order, then $$\frac{A}{R} \approx \frac{HS - j\alpha(H''S + 2H'S' + S''H)}{S - j\alpha S''}$$

where primes indicate derivatives with respect to frequency.

$$\frac{A}{R} \approx H \frac{1 - j\alpha\left(\frac{H''}{H} + 2\frac{H'}{H}\frac{S'}{S} + \frac{S''}{S}\right)}{1 - j\alpha\frac{S''}{S}}$$

$$\boxed{\frac{A}{R} \approx H - j\alpha\left(H'' + 2H'\frac{S'}{S}\right)}$$

to first order.

Notice that there is a first order error due to sweeping (the $\alpha$ term) if the second derivative of the DUT is non-zero, or if the source is not flat and the first derivative of the DUT is non-zero.

Enough pure math. Let's do an example—a bandpass filter.

and let $s = j(\omega + \omega_n)$
so that we can expand around the resonant frequency, $\omega_n$.

let $H(S) = \dfrac{KS}{S^2 + \dfrac{\omega_n}{Q}S + \omega_n^2}$ $$H(j\omega_n + j\omega) = \frac{j\left(1 + \frac{\omega}{\omega_n}\right)\omega_n K}{-2\omega\omega_n - \omega^2 + \frac{j}{Q}(\omega\omega_n + \omega_n^2)}$$

$$= \frac{1 + \frac{\omega}{\omega_n}}{\frac{\omega_n}{QK} + \omega\left(\frac{1}{QK} - \frac{2}{jK}\right) - \frac{\omega^2}{j\omega_n K}}$$

synthetic division gives:

$$\frac{\frac{Q}{\omega_n} - j\frac{2Q^2}{\omega_n^2}\omega + \frac{jQ - 4Q^2}{\omega_n^3}Q\omega^2 + \frac{-jQ + 4Q^2j8Q^3}{\omega_n^4}Q\omega^3}{\frac{\omega_n}{Q} + \omega\left(\frac{1}{Q} + 2j\right) + \frac{j\omega^2}{\omega_n}\bigg| 1 + \frac{\omega}{\omega_n}}$$

$$\vdots$$

$$\rightarrow (jQ - 5Q^2 - j8Q^2 + 16Q^3 - 4jQ^3)\frac{\omega^4}{\omega_n^4}$$

So to the first order (from Taylor Series Expansion)

$$H(\omega) = \frac{KQ}{\omega_n} - j\frac{2Q^2}{\omega_n^2}K\omega$$

and $$j\alpha H'(\omega) = 2\alpha\frac{-Q^2 - j4Q^3}{\omega_n^3}K + 6\alpha\frac{Q^2 + 4jQ^3 - 8Q^4}{\omega_n^4}K\omega$$

Resonance is defined as when imaginary part equals zero (zero phase).

$Im(H - j\alpha H') = 0$ (If the source is flat enough to ignore second term, i.e., $$\frac{S'}{S} \ll \frac{1}{2} \frac{H'}{H}).$$

So to the first order $$\frac{-2Q^2K}{\omega_n} \omega = \frac{-8\alpha Q^3 K}{\omega_n^3} + \frac{24\alpha Q^3 K}{\omega_n^4} \omega$$

or $$\frac{\omega}{\omega_n} = \frac{8\alpha Q}{24\alpha Q + 2\omega_n^2}$$

$$\boxed{\frac{\omega}{\omega_n} \approx \frac{4\alpha Q}{\omega_n^2}}$$

Crystal Testing

Now, typically we need to sweep over a frequency span of 10 B$\omega$(= 10 $\omega_n/Q$) because the center frequency is not precisely known, and we need to look for spurious resonances on the skirts. Also, we would like to sweep fast, say, 0.1 secs/sweep $$\alpha = \frac{10 \frac{\omega_n}{Q}}{2(0.1)} = 50 \frac{\omega_n}{Q}$$

$$\frac{\omega}{\omega_n} \approx \frac{200}{\omega_n}$$

so the absolute frequency error is about $$\boxed{32 \text{ Hz}}$$

which is a fairly high error for a precision, low-frequency crystal. It would, of course, be reduced if we reduced the sweep rate. For example, a 3.2 sec. sweep time would give a 1 Hz error.

If the DUT were a multi-pole filter, the error would go up roughly with the complexity of the filter.

Check:

We ignored the term $\frac{S'}{S}$

That is, the source must be fairly flat over the bandwidth of the DUT. In the case of a leveled source, this condition is very easy to meet.

We need $$\frac{S'}{S} \ll \frac{1}{2} \frac{H'}{H}$$

$$\ll \frac{1}{2} \frac{2 \frac{jQ - 4Q^3}{\omega_n^3} K}{2\left(-j\frac{2Q^2}{\omega_n^2}\right)K} = \frac{4Q - 1}{2\omega_n}$$

$$\frac{S' \cdot \frac{\omega_n}{2Q}}{S} \ll 1$$

Sweep Error Correction

Suppose that we follow each channel of the Network Analyzer with a digital filter to correct for the parabolic phase sweeping error.

Let's start with just a simple 3 tap F/R filter, shown in FIG. 5 of the patent. Again, the network under test has a transfer function of h(t), and the filter has a transfer function of g(t). The output is represented as Z(nT).

Since it is the low order error terms that are causing the problem, let's pick $b_0$ and $b_1$ to force the low order expansion terms to zero.

$$Z(nT) = \int_{-\infty}^{\infty} h(\tau)G(-j2\alpha\tau) e^{j\alpha\tau^2} [b_0 + b_1 e^{+2\alpha T\tau} +$$

$$b_1 e^{-2\alpha T\tau}] \times e^{-j(2\alpha n'T)\tau} d\tau$$

expand $$e^{j\alpha\tau^2} [b_0 + 2b_1 \cos 2\alpha T\tau]$$

$$\left[1 + j\alpha\tau^2 + \frac{1}{2}(j\alpha\tau^2)^2 + \ldots\right]\left[(b_0 + 2b_1) - 2b_1 \frac{1}{2!}(2\alpha T\tau)^2 + \ldots\right]$$

Using the NBS math tables, we get $$c_0 \quad b_0 + 2b_1 = 1$$
$$c_1 \quad 0 - 0 = 0$$
$$c_2 \quad -b_1 4\alpha^2 T^2 + j\alpha = 0$$

so

Continuing the $$\boxed{b_1 = j\frac{1}{4\alpha T^2} \quad b_0 = 1 - j\frac{1}{2\alpha T^2}}$$

expansion, we get $$c_3 \quad 0 + 0 + 0 + 0 = 0$$

$$c_4 \frac{2b_1}{4!} 16\alpha^4 T^4 + j\alpha \frac{(-2b_1)}{2} 4\alpha^2 T^2 +$$

$$\frac{1}{2} j\alpha^2 = \frac{1}{2} \alpha^2 + j\frac{1}{3} \alpha 3T^2$$

for the first error term.

So, expanding as before using derivatives, yields $$R_c\left(\frac{\omega}{2\alpha}\right) =$$

$$\left[1 + \left(\frac{1}{2}\alpha^2 + \frac{1}{3}j\alpha^3T^2\right)D^4 + \ldots\right]S\left(j\frac{\omega}{2\alpha}\right)$$

where the subscript C indicates "corrected."

$$\frac{A_c}{R_c} = \frac{HS + \left(\frac{1}{2}\alpha^2 + \frac{1}{3}j\alpha^3 T^2\right)[H^{(4)}S + 4H^{(3)}S^{(1)} + 6H^{(2)}S^{(2)} + 4H^{(1)}S^{(3)} + HS^{(4)}]}{S + \left(\frac{1}{2}\alpha^2 + \frac{1}{3}j\alpha^3 T^2\right)S^4}$$

(Superscript in parens is derivative with respect to frequency)

Again, if the source is sufficiently flat, $$\frac{A_c}{R_c} \approx H + \left(\frac{1}{2}\alpha^2 + \frac{1}{3}j\alpha^3 T^2\right)H^{(4)}$$

Using the expansion for H, we get to the first order in $\omega$:

$$\frac{A_c}{R_c} \approx K\frac{Q}{\omega_n} - jK\frac{2Q^2}{\omega_n^2}\omega +$$

$$K\left(\frac{1}{2}\alpha^2 + \frac{1}{3}j\alpha^3 T^2\right)4!\,(jQ -$$

$$5Q^2 - j8Q^3 + 16Q^3 - 4jQ^3)\frac{Q}{\omega_n^5}$$

Again, resonance is defined as when the imaginary part is zero:

$$\frac{2Q^2}{\omega_n}\cdot\frac{\omega}{\omega_n} = \frac{4!Q^2}{\omega_n^5}\left(\frac{1}{2}\alpha^2 - 4\alpha^2 Q - 2\alpha^2 Q^2 -\right.$$

$$\left.\frac{5}{3}\alpha^3 T^2 Q + \frac{16}{3}\alpha^3 T^2 Q^2\right)$$

Since Q is large, $$\frac{\omega}{\omega_n} = \frac{12\alpha^2 Q^2}{\omega_n^4}\left(-2 + \frac{16}{3}\alpha T^2\right)$$

the second term is small for reasonable sweeps:

$$\alpha T^2 << \frac{6}{16}$$

$$\frac{\omega_{span}}{2T_{span}}\left(\frac{T_{span}}{400}\right)^2 << \frac{6}{16}$$

$$\omega_{span} << \frac{6}{16}\cdot 32 \times 10^4/0.1\text{ sec}$$

$$<< 1.2 \times 10^6 \text{ rad/sec}$$

Then the error is $$\frac{\omega}{\omega_n} = -\frac{24\alpha^2 Q^2}{\omega_n^4}$$

Using the same 10x bandwidth criteria for sweep width as before, the error becomes $$\omega_{err} = -\frac{24Q^2}{\omega_n^3}\left(50\frac{\omega_n}{Q}\right)^2 = -24 \cdot 2500/\omega_n$$

$$F_{err} = -\frac{9550}{\omega_n}$$

which is extremely small for resonance frequencies above 1 KHz.
(recall uncorrected error was 32 Hz).

Up-Down Sweeping

Another way to partially correct for the parabolic phase error term is to add the results of an up frequency sweep and the conjugate of a down frequency sweep.

To show this, note that the $e^{j\alpha t^2}$ source we used puts out negative frequencies for negative t and positive frequencies for positive t. Hence, it first sweeps down to zero frequency and then back up.

Proof:

$$\overline{y(-t)} = \int_{-\infty}^{\infty} h(\tau)\, \overline{G(-j2\alpha\tau)}\cos\alpha\tau^2 e^{-j(2\alpha t)\tau}d\tau$$

$$\frac{1}{2}[y(t) + \overline{y(-t)}] = \frac{1}{2}\int_{-\infty}^{\infty} h(\tau)e^{j\alpha\tau^2}G(-j2\alpha\tau)e^{-j(2\alpha t)\tau}d\tau +$$

$$\frac{1}{2}\int_{-\infty}^{\infty} h(\tau)e^{-j\alpha\tau^2}G(-j2\alpha\tau)e^{-j(2\alpha t)\tau}d\tau$$

if G is real (as is normal)
(bar means conjugate)

The expansion of $\cos\alpha\tau^2$ shows every other term in $\tau^2$ has been canceled as desired, at the expense of two sweeps.

FRA Application

Another application for sweep speed improvements is finding narrow (mechanical) resonances in electromechanical control systems. In this case, the span is much wider than in finding the resonant frequency zero phase point. Therefore, it is desirable to have even higher sweep rates and higher order corrections.

Other Parabolic Phase Equalizer Implementations

1) This could be done, of course, with an FFT, multiply by parabolic phase and then inverse FFT. Since the FFT would be built in to a control systems box, this may be a valid path for these instruments.

2) The FIR structure could be extended to include more taps.

3) $$e^{j\alpha\tau^2} = \frac{e^{j\frac{\alpha}{2}\tau^2}}{e^{-j\frac{\alpha}{2}\tau^2}}$$

can lead to a pole-zero design.

4) A design of parallel filters can be used if the sweep rate is restricted.

To see this, note that the output from a digital filter following the network analyzer is:

$$Z(nT) = \Sigma_m a_m y(nT - mT)$$

$$= \int_{-\infty}^{\infty} h(\tau) G(-j2a\tau)[e^{ja\tau^2} \Sigma_m a_m e^{+j2a\tau mT}] e^{-j2a\tau nT} d\tau$$

To force the bracketed term to unity:

$$e^{-ja\tau^2} = \Sigma_m a_m e^{j2a\tau mT}$$

$$\int_{-\infty}^{\infty} e^{-ja\tau^2} e^{-j2a\tau nT} d\tau = \Sigma_m a_m \int e^{j2a\tau(m-n)T} d\tau$$

$$e^{j\frac{(2anT)^2}{4a}} = a_n$$

$$e^{jn^2aT^2} = a_n$$

Now we note that if we restrict $aT^2$ to $$aT^2 = \frac{2\pi}{M^2} \quad (M \text{ an integer})$$

then $\quad n^2 aT^2 = \frac{2\pi}{M^2}(KM + m)^2$ where $\quad 0 \le M \le M - 1$ $\quad 0 \le K$ and $$e^{jn^2aT^2} = e^{j2\pi K1} e^{j2\pi \frac{M^2}{M^2}} e^{j4\pi \frac{MK}{M}}$$

Figure 6:
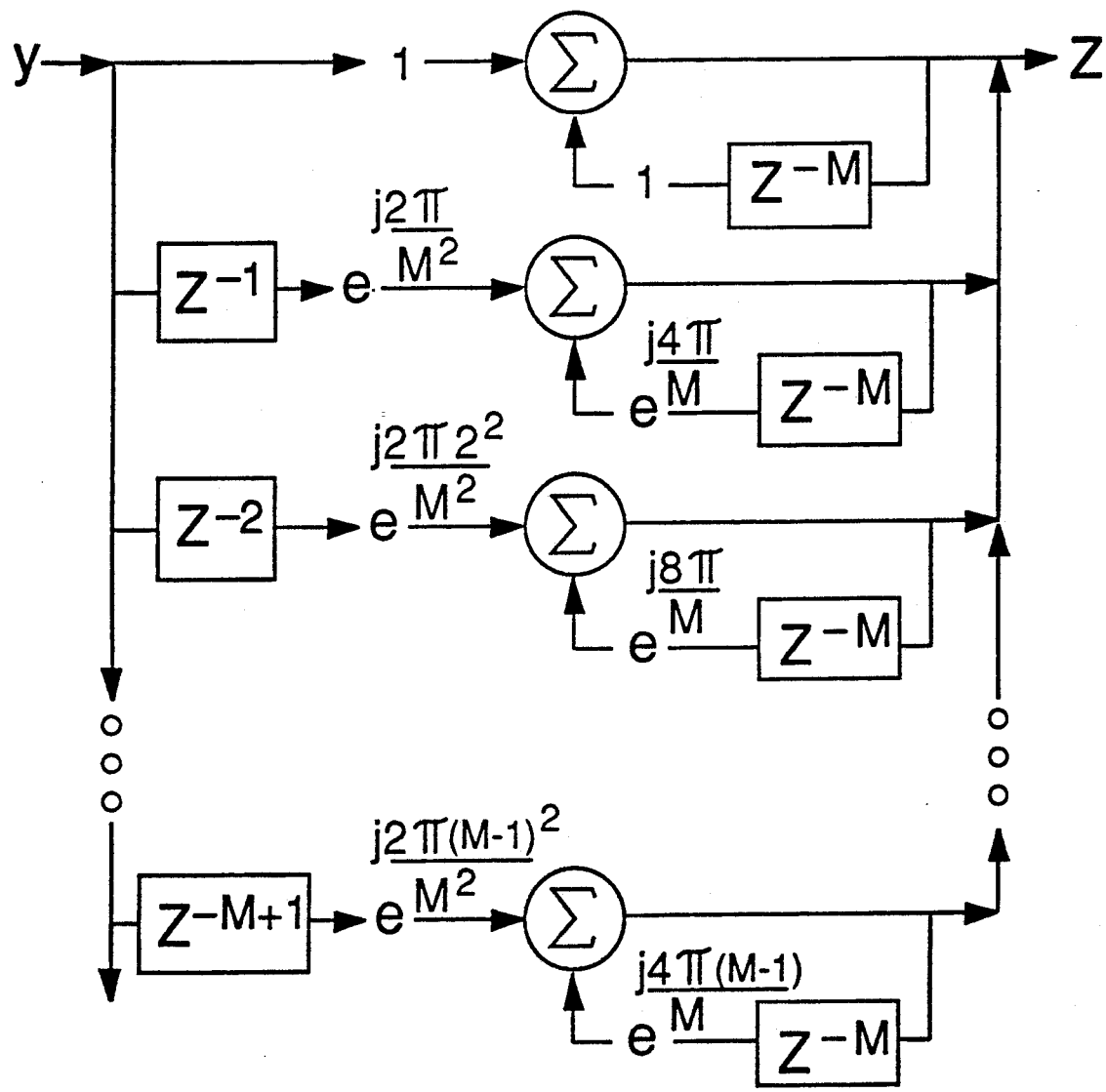
FIGS. 6 and 7 are block diagrams showing parabolic phase equalizers discussed in Appendix F.

This can be implemented in the fashion shown in FIG. 6 of the foregoing patent specification. (This design is borrowed from an article on Radar Filter design.)

Note that if you want to vary the sweep rate, you must vary the sampling rate T or change the filter coefficients by changing M. (Some $M_1$, like $M=8$, greatly reduce the number of multiplies.)

Figure 7:
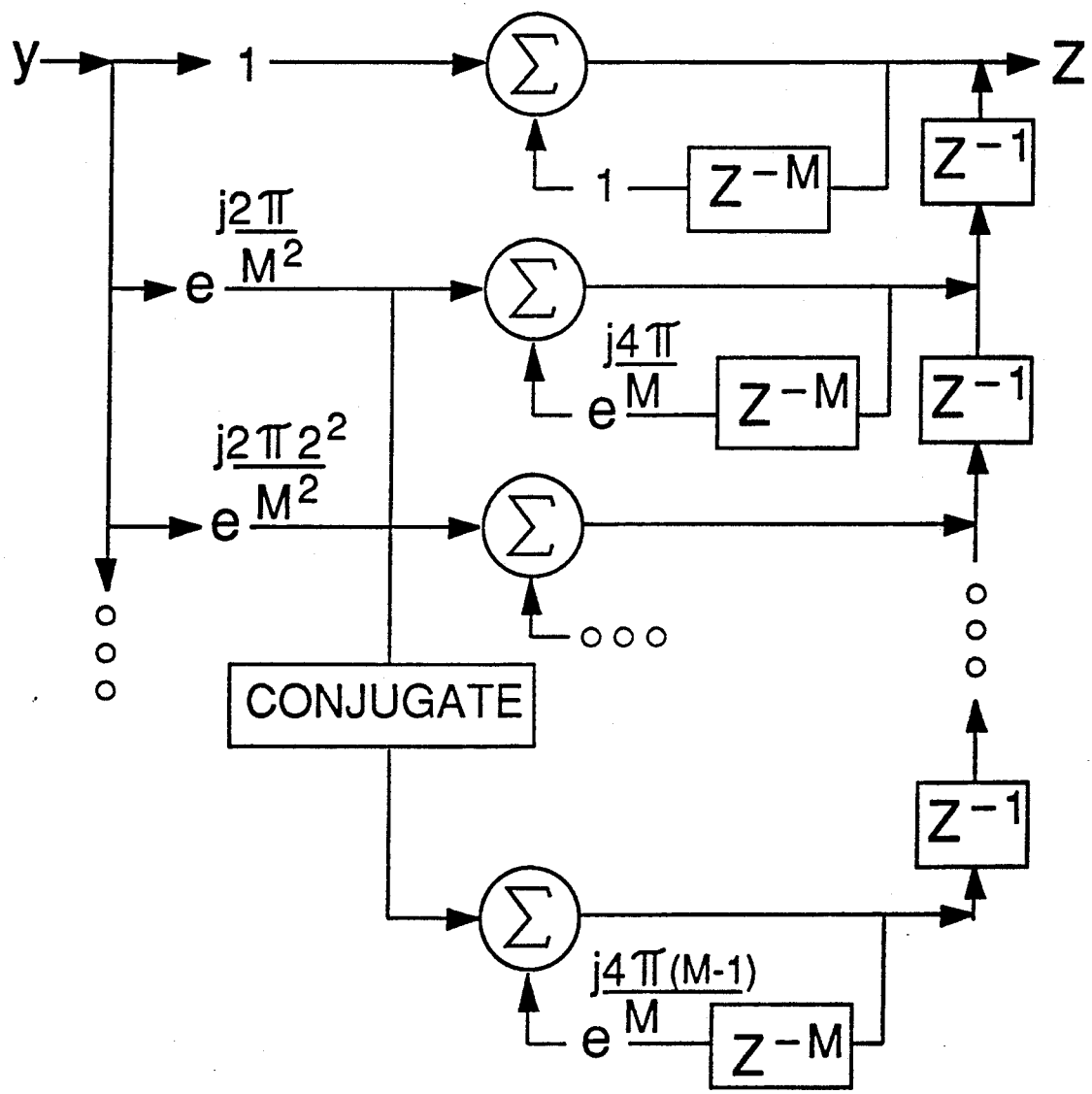

Further Notes to Radar Chirp Filter Design (Refer to FIG. 7 of the foregoing patent specification)

1) Note that the delays are not canonical as drawn. A unit delay between each filter is all that is necessary. Also note that multiplies can be eliminated due to symmetries.

Further reductions are possible if M is highly composite (e.g., $M=2^5$, as in the FFT algorithms), but this puts further restrictions on the allowed sweep rates.

2) In this design, the poles are on the unit circle and so potentially unstable due to truncation errors. Stability could be ignored since filter will be reset every sweep, or the poles could be moved inside the unit circle by a uniform amount. This would give an exponentially damped chirp in the time domain. It does not require any additional multiplies.

Note on Derivation of Fourier Transform of Chirp

In the foregoing analysis, some math was skipped over:

$$a_n = \int_{-\infty}^{\infty} e^{-ja\tau^2} e^{-j2a\tau nT} d\tau = e^{jan^2T^2} \int_{-\infty}^{\infty} e^{-j2(\tau+nt)^2} d\tau$$

-continued let $u = \sqrt{\frac{2}{\pi} a} \; (\tau + nT)$ then $$a_n = e^{jan^2T^2} \sqrt{\frac{\pi}{2} a} \int_{-\infty}^{\infty} e^{-j\frac{\pi}{2} u^2} du$$

Using Fressnel Integrals (from NBS math tables)

$$a_n = \sqrt{\frac{\pi}{2a}} e^{jan^2T^2} [C(\infty) - C(-\infty) - jS(\infty) + jS(-\infty)]$$

$$= \sqrt{\frac{\pi}{2}} e^{jan^2T^2} (1 - j)$$

$$= \sqrt{\frac{\pi}{2a}} e^{j(an^2T^2 - \frac{\pi}{4})}$$

Now, let us consider the effects of the anti-alias, noise-reduction filter $G_1$ on the windowed estimate of the transfer function:

Repeating from above:

$$Z(nT) = \int_{-\infty}^{\infty} h(\tau) G(-j2a\tau) e^{ja\tau^2} \Sigma_m a_m e^{j2a\tau mT} \cdot e^{-j2a\tau nT} d\tau$$

Note that the sampling can alias the tail end of the impulse response into the front unless G cuts off the impulse response at some point.

Therefore, if G only passes frequencies between $\pm \omega_c$, the limits of integration can change to $$Z(nT) = \int_{-\frac{\omega_c}{2a}}^{\frac{\omega_c}{2a}} h(\tau) G(-j2a\tau) e^{ja\tau^2} \Sigma_m e^{j2a\tau mT} e^{-j2a\tau nT} d\tau$$

Now, since $h(\tau)$ is an actual device, $$h(\tau) = 0 \; \tau < 0$$

and, to the desired accuracy of measurement, all the energy of $h(\tau)$ is within the time interval $$0 < \tau < \tau_c$$

(i.e., all poles are off axis.)

So, to accurately characterize the DUT, G must pass the impulse, which requires $$2a\tau_c < \omega_c$$

$$\boxed{\alpha < \frac{\omega_c}{2\tau_c}}$$

This is the fastest a network analyzer can sweep, even with a phase equalizing filter. Faster than this and G windows off enough energy to affect the results. Note that this sweep rate is dependent on the DUT ($\tau_c$) and on the analyzer filter bandwidth ($\omega_c$). To get an idea of this limit, consider the following example:

$$\tau_c \simeq \frac{5}{BW}$$

where $BW$ = bandwidth of $DUT$.

$$F_{span} = 10BW$$

$$\alpha = \frac{F_{span} \cdot 2\pi}{2T_{span}}$$

$$F_c \simeq 2 \text{ KHz} \quad (1 \text{ KHz } BW \text{ on } 77)$$

$$\frac{2\pi \cdot 10BW}{2T_{span}} < \frac{2\pi \cdot 2 \times 10^3 BW}{2 \cdot 5}$$

This is $$\boxed{T_{span} > 25 \text{ msec}}$$

fortunately just a little faster than the maximum usable update rate of 50 msec (flicker-free display).

Now, if wee sweep slower than $$\frac{\omega_c}{2\tau_c}$$

we still need to correct for the parabolic phase error. For sufficiently slow sweeps with respect to $\omega_c$, the limits of integration become small, and the parabolic error remains small and need not be compensated.

phase error then equal:

$$\alpha\tau^2 < \alpha \frac{\omega_c^2}{4\alpha^2}$$

Again, for the sake of discussion, assume the error is acceptable for phase error $< \pi$.

$$\begin{cases} \pi < \frac{\omega_c^2}{4\alpha} \\ \alpha < \frac{\omega_c^2}{4\pi} \end{cases}$$

$$\frac{\omega_c}{2\tau_c} > \frac{\omega_c^2}{4\pi}$$

$$\boxed{\frac{1}{\tau_c} > F_c}$$

So, for DUTs much wider than the network analyzer filter, the phase error is small, and the equalizer doesn't improve the sweep rate (about 25 msec. sweep time as before).

However, for narrower bandwidth DUTs, the equalizer could allow you to still sweep at 25 msec. sweep time instead of reducing $\alpha$ by increasing the sweep time to keep the $\alpha\tau_c^2$ phase error small. (Note that at low sweep rates, $h(\tau_c)=0$ becomes limit, and G no longer windows the impulse response.)

Again, as an example:

$$\alpha\tau_c^2 < \pi$$

-continued $$\frac{2\pi}{2} \cdot \frac{10\frac{5}{\tau_c}}{T_{span}} \tau_c^2 < \pi$$

$$\boxed{T_{span} > 50\tau_c}$$

Note that without the equalizer, narrow DUTs determine the measurement time.

In the foregoing discussion, it has been demonstrated that it is possible to design an equalizer, independent of the device-under test, which makes the measurement accuracy independent of the DUT characteristics over a wide range of analyzer sweep rates.

In the first part of the discussion, the overall Network Analyzer equation was derived, and it was shown that the noise-limiting filter in the network analyzer "windows" the Fourier transform with its frequency domain shape. Also, the act of sweeping adds a parabolic phase error which must be minimized by an equalizer or by slow sweep rates.

Next, it was shown that normalization by dividing the output by the stimulus frequency response does remove the source level, but does not fully remove the source flatness effects from the measurement. Again, slowing down the sweep rate or adding an equalizer can reduce the problem to an arbitrarily small quantity.

It was also demonstrated that the predicted errors are significant for narrow-band filters like crystals, but are easily compensated by simple equalizer designs.

In subsequent discussion, other methods for compensating for the sweeping errors were noted, including up/down sweeps, FFT and parallel filter implementations.

Finally, in the immediately foregoing discussion, it was determined that—even with parabolic-phase error correction—that there is a maximum limit on the sweep rate determined by the analyzer and DUT bandwidths. This limit is caused by significant energy falling outside the analyzer's bandwidth.

Further Observations

Parabolic filters have been used in Chirp Radars for years, but the design and theory is quite different than the error equalizer described here. In radar, the filter's time response is matched to the transmitted chirp and is therefore as long as the transmitted chirp. In the network analyzer case, the overall combination of filter and equalizer is not matched to the stimulus sweep. (If it were matched, the analyzer bandwidth would have to be as wide as the sweep span.)

As previously stated, the analyzer filter windows the frequency transform. The next question is the optimal window shape.

Figure 8:
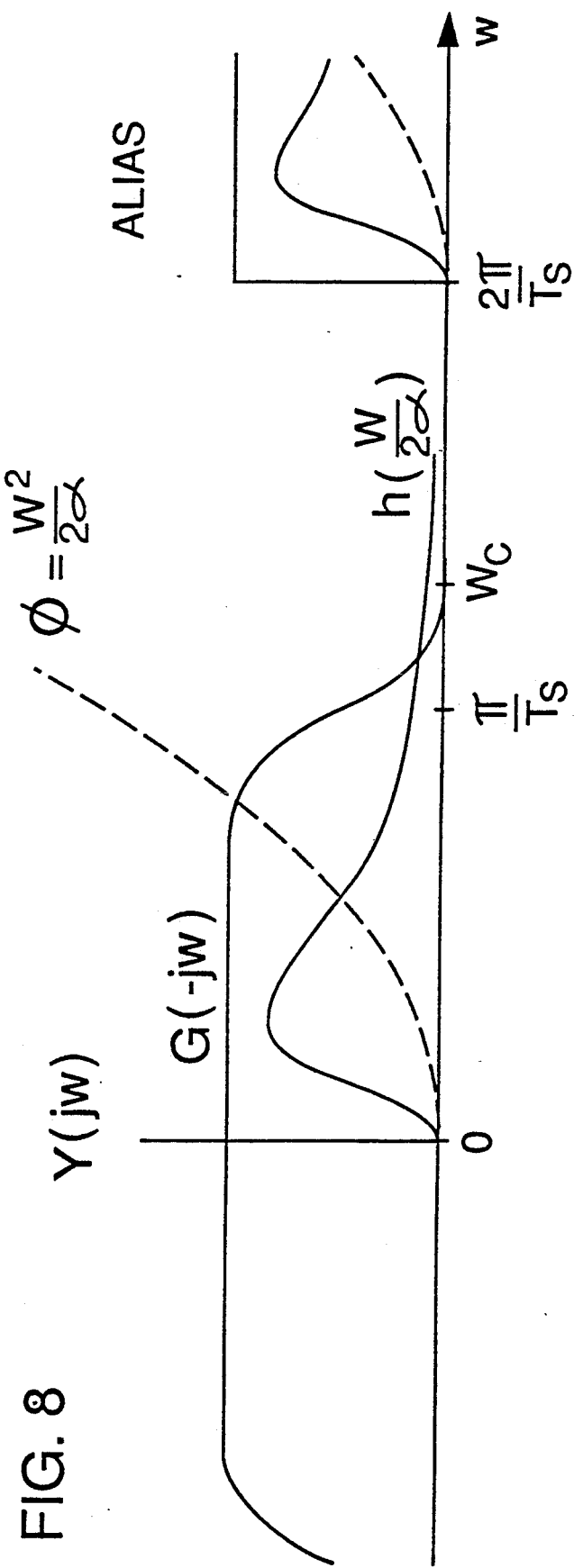
FIG. 8 is a diagram showing aliasing and filtering of significant energy in the fundamental network analyzer equation also discussed in Appendix F.

If, at the desired sweep rate, the DUT impulse response falls entirely within the filter (see FIG. 8 of the foregoing patent specification, which shows aliasing and filtering of significant energy in the fundamental network analyzer equation), then the filter should be flat to give a uniform window.

If, on the other hand, significant energy fall outside the filter, then experience with the impulse response of mechanical structures suggests the use of an exponential window. Such a widow changes the damping (or Q) estimate of all poles and zeros by effectively moving the imaginary axis to the right. (Note that this design calls for a filter with an exponential frequency response, not the single-pole exponential time response.)

Obviously, other window shapes could be selected to satisfy other criteria. Perhaps the most interesting is a window to avoid the picket-fence effect. Particularly with wide sweeps, it is all too easy to find DUTs with resonances that are much sharper than the analyzer's display resolution. If we select a window to get the best estimate of the Fourier transform at the display points, it will miss the spurious DUT resonances. Such a condition is unacceptable in many measurements. To avoid this, a window shape like the digital signal analyzer "flat-top" window (for spectrum analysis) could be used.

Since we have a conflict on the optimum window (e.g., best estimate at each frequency for curve fitting work like pole-zero extraction or resonate frequency estimation AND finding spurious resonances), perhaps swept network analyzers should offer a selection of window shapes as digital signal analyzers do.

Separable Window Functions

As we saw in an earlier discussion, dividing by the source transform does not fully remove the source flatness under many conditions. Let us consider what window shape is desired when the parabolic phase error is completely removed.

$$R(t) = \int_{-\infty}^{\infty} s(\tau) W(-j2\alpha\tau) e^{-j2\alpha t\tau} d\tau$$

Where:
W is the window shape (the filter frequency response)
S is the source flatness equivalent filter impulse response, and
R is the reference channel response:

$$A(t) = \int_{-\infty}^{\infty} [h(\tau) \circledast s(\tau)] W(-j2\alpha\tau) e^{-j2\alpha t\tau} d\tau$$

$h(\tau)$ is the impulse response of DUT
A is the A channel response:

let $\tau_2 = \tau - \tau_1$ $$A(t) = \int_{-\infty}^{\infty} \int_{-\infty}^{\infty} h(\tau - \tau_1) \cdot s(\tau_1) d\tau_1 W(-j2\alpha\tau) e^{-j2\alpha t\tau} d\tau$$

$$A(t) = \int_{-\infty}^{\infty} s(\tau_1) \int_{-\infty}^{\infty} h(\tau - \tau_2) W(-j2\alpha\tau) e^{-j2\alpha t\tau} d\tau d\tau_1$$

$$A(t) = \int_{-\infty}^{\infty} s(\tau_1) \int_{-\infty}^{\infty} h(\tau_2) W(-j2\alpha(\tau_2 + \tau_1)) e^{-j2\alpha t(\tau_2 + \tau_1)} d\tau_2 d\tau_1$$

$$= \int_{-\infty}^{\infty} S(\tau_1) e^{-j2\alpha t\tau_1} \int_{-\infty}^{\infty} h(\tau_2) W(-j2\alpha(\tau_2 + \tau_1)) e^{-j2\alpha t\tau_2} d\tau_2 d\tau_1$$

Note that A/R will exactly cancel out the source equivalent filter s, if W is separable, i.e., $$W(-j2\alpha(\tau_2+\tau_1)) = W(-j2\alpha\tau_2)W(-j2\alpha\tau_1)$$

Note that since h is causal, $h(\tau_2)=0$ for $\tau_2 < 0$. If this is also true for S, then the above separable condition is satisfied by the single-sided exponential window function.

This is the same window function that is considered optimal for impulse responses that do not die out inside the digital signal analyzer time record. However, note that in the digital signal analyzer case, a force window is used with the stimulus, and therefore exact cancellation does not occur.

So, there are two reasons to use the exponential window when estimating or curve fitting. First, it fully removes the source unflatness and second, the windowing effects move the imaginary axis by a predictable amount which can be easily removed from the estimated pole and zero locations.

Filter Implementations

It is not within the scope of this appendix to go into the optimal implementation of an network analyzer. However, it is useful to observe that it would be desirable to use a single analog filter per channel and implement the window shapes and phase corrections (which depend on sweep rate) digitally.

An interesting analog filter to consider is the Nyquist zero symbol interference filter. For this class of filters, $G(j\omega)$, you get $$\begin{cases} g(o) = 1 \\ g(nT) = 0 \end{cases}$$

$n = \pm 1, \pm 2, \pm 3, \ldots$ all other points unspecified

To see why this is an interesting class of filters, let us repeat an earlier analysis.

$$Z(nT) = \int_{-\infty}^{\infty} h(\tau)[G(-j2\alpha\tau)e^{j\alpha\tau^2}\Sigma_m a_m e^{j2\alpha\tau mT}] \cdot e^{-j2\alpha\tau nT} d\tau$$

We want (as before)

$$W(\tau)e^{-j\alpha\tau^2} = G(-j2\alpha\tau)\Sigma_m a_m e^{j2\alpha\tau mT}$$

where W is the desired window function. Taking the Fourier transform yields $$\int_{-\frac{\omega_c}{2\alpha}}^{\frac{\omega_c}{2\alpha}} \omega(\tau) e^{-j\alpha\tau^2} e^{-j2\alpha\tau nT} d\tau =$$

-continued $$\int_{-\frac{\omega_c}{2a}}^{\frac{\omega_c}{2a}} G(-j2a\tau)\Sigma \, {}^{\iota}a_m e^{j2a\tau(m-n)T} d\tau$$

Where again the $W_c$ limits are determined by the filter cutoff.

Now, in general, the summation on the right makes this a messy matrix solution for the $a_m$ (the FIR filter tap weights). However, if we restrict G to the zero ISI Nyquist filter, then $$2aT \int_{-\frac{\omega_c}{2a}}^{\frac{\omega_c}{2a}} \omega(\tau) e^{-ja\tau^2} e^{-j2a\tau nT} d\tau = a_n$$

This is the Fressnel Integral, and solutions for various W are given in the NBS math tables.

Notes

1) It may be desirable to build as two digital filters—one that determines the window shape and noise bandwidth (with decimation), and a second that does the parabolic phase correction.

2) Because the coefficients were determined by a Fourier Series, the filter will match the parabolic phase window to a best RMS fit. A Chebyshev fit could be used instead.

Conclusions

It is possible to use modern digital signal processing techniques to improve the accuracy and speed of swept network analyzers and FRAs. These instruments can be built today with off-the-shelf DSP hardware of moderate cost. The increasing demand for higher speed testing of RF devices in manufacturing and the R&D needs for high accuracy measurements and curve fitting will soon make these techniques mandatory.

Having described and illustrated the principles of our invention with reference to preferred embodiments thereof, it will be apparent that invention can be modified in arrangement and detail without departing from such principles. For example, while the spectrum analyzer is illustrated with reference to a digital IF filter, it will be recognized that a variety of other filters may alternatively be used. For example, surface acoustic wave (SAW) filters can be used and can be made to have nearly flat group delay characteristics. In view of the many possible embodiments to which the principles of our invention may be put, it should be recognized that the detailed embodiments are illustrative only and should not be taken as limiting the scope of our invention. Rather, we claim as my invention all such embodiments as may come within the scope and spirit of the following claims and equivalents thereto.

We claim:

1. In a method of network analysis comprising the steps:
    exciting a network under test (40) with a swept sine wave stimulus to yield an output signal;
    sweeping a variable frequency oscillator (41) to mix said output signal to an intermediate frequency signal;
    filtering the intermediate frequency signal; and
    detecting the amplitude and phase of the filtered intermediate frequency signal to determine a transfer characteristic of the network under test as a function of frequency;
    an improvement wherein the method further includes
    filtering the intermediate frequency signal with a filter that has a substantially parabolic phase characteristic; and
    compensating for errors in the detected amplitude and/or phase introduced by said sweeping.

2. The method of claim 1 in which:
    the filter has a first bandwidth;
    the sine wave stimulus is swept over a second bandwidth different than the first bandwidth, wherein the filter is not matched to the sweep; and
    the compensating step includes compensating for a parabolic phase error introduced by sweeping through the filter.

3. The method of claim 2 in which the compensating step includes cascading a finite impulse response filter with the filter that has the substantially parabolic phase characteristic.

4. The method of claim 2 in which the compensating step includes:
    exciting the network during a first sweep with a sine wave swept from a first frequency to a second frequency;
    detecting the complex amplitude of the filtered intermediate frequency signal during the first sweep;
    exciting the network during a second sweep with a sine wave swept from the second frequency to the first frequency;
    detecting the complex amplitude of the filtered intermediate frequency signal during the second sweep; and
    summing the complex amplitude detected in the first sweep with the conjugate of the complex amplitude detected in the second sweep and determining therefrom a transfer characteristic of the network under test.

5. The method of claim 2 which further includes:
    performing a discrete Fourier transform on a set of data comprising the detected amplitude and phase as a function of sweep frequency;
    multiplying the results of said transform with a parabolic phase correction factor; and
    performing a reverse Fourier transform on the multiplied results.

* * * * *